United States Patent
Liang et al.

(10) Patent No.: US 12,542,097 B2
(45) Date of Patent: Feb. 3, 2026

(54) DRIVE CIRCUIT AND DISPLAY DEVICE

(71) Applicant: Huawei Technologies Co., Ltd., Shenzhen (CN)

(72) Inventors: Bo Liang, Shenzhen (CN); Hu He, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/901,998

(22) Filed: Sep. 30, 2024

(65) Prior Publication Data

US 2025/0022409 A1 Jan. 16, 2025

Related U.S. Application Data

(63) Continuation of application No. PCT/CN2023/084106, filed on Mar. 27, 2023.

(30) Foreign Application Priority Data

Apr. 2, 2022 (CN) .......................... 202210343133.3

(51) Int. Cl.
*G09G 3/32* (2016.01)

(52) U.S. Cl.
CPC ....... *G09G 3/32* (2013.01); *G09G 2300/0842* (2013.01); *G09G 2310/08* (2013.01); *G09G 2320/0247* (2013.01); *G09G 2330/023* (2013.01)

(58) Field of Classification Search
None
See application file for complete search history.

(56) References Cited

U.S. PATENT DOCUMENTS

| | | | |
|---|---|---|---|
| 10,381,426 | B2 | 8/2019 | Ka et al. |
| 10,504,432 | B2 | 12/2019 | Lin et al. |
| 2015/0103037 | A1 | 4/2015 | Wu et al. |
| 2021/0020109 | A1* | 1/2021 | Lin .................... H10K 59/1213 |
| 2021/0125543 | A1 | 4/2021 | Kim et al. |

FOREIGN PATENT DOCUMENTS

| | | |
|---|---|---|
| CN | 108288457 A | 7/2018 |
| CN | 111489701 A | 8/2020 |
| CN | 111754922 A | 10/2020 |
| CN | 113823222 A | 12/2021 |
| JP | 2006072377 A | 3/2006 |

* cited by examiner

*Primary Examiner* — Christopher J Kohlman
(74) *Attorney, Agent, or Firm* — Slater Matsil, LLP

(57) ABSTRACT

A drive circuit and a display device are provided. Changes in control electrode voltages of switching transistors do not couple a control electrode voltage of a drive transistor. The drive circuit may support different levels of image refresh frequencies at the same time, and implement seamless switching between different image refresh frequencies. The drive circuit may include a storage capacitor, the drive transistor, and the switching transistors. The drive transistor may be configured to control a drive current of the light-emitting diode, and the switching transistors may control the control electrode voltage of the drive transistor and compensate for a threshold voltage of the drive transistor. Other embodiments are described herein.

20 Claims, 9 Drawing Sheets

DRIVE CIRCUIT AND DISPLAY DEVICE

CROSS-REFERENCE TO RELATED APPLICATIONS

This application is a continuation of International Application No. PCT/CN2023/084106, filed on Mar. 27, 2023, which claims priority to Chinese Patent Application No. 202210343133.3, filed on Apr. 2, 2022. The disclosures of the aforementioned applications are hereby incorporated by reference in their entireties.

TECHNICAL FIELD

This application relates to the field of semiconductor technologies, and more specifically, to a control circuit and a display device.

BACKGROUND

With rapid development of science and technology, semiconductor devices have been widely used in display devices (for example, mobile phones and watches). The display device may include a plurality of light-emitting devices (for example, light-emitting diodes) and a plurality of drive circuits configured to drive the light-emitting diodes.

In a drive circuit provided in a related technology, a change in a control electrode voltage of a switching transistor couples a control electrode voltage of a drive transistor. As a result, a forward gamma voltage of a light-emitting diode increases, which means that brightness of the light-emitting diode decreases, leading to high power consumption of the drive circuit.

Therefore, a technical solution that can enhance brightness of the light-emitting diode and reduce power consumption of the drive circuit is urgently needed.

SUMMARY

This application provides a drive circuit and a display device. A change in a control electrode voltage of a switching transistor does not couple a control electrode voltage of a drive transistor, so that a forward gamma voltage of a light-emitting diode is reduced, and brightness of the light-emitting diode is enhanced, thereby reducing power consumption of the drive circuit.

According to a first aspect, this application provides a drive circuit, and the drive circuit may include a first transistor (used as a drive transistor), a second transistor (used as a switching transistor), a third transistor (used as a switching transistor), a fourth transistor (used as a switching transistor), and a storage capacitor.

The first transistor may be configured to be electrically connected to a first power supply, a second power supply, a first node, and a third node. The second transistor may be configured to be electrically connected to the third node, a light emission control circuit, and a light-emitting diode. The third transistor may be configured to be electrically connected to the first node, a first control circuit, and a second node. The fourth transistor may be configured to be electrically connected to the second node, a second control circuit, and a third power supply. The storage capacitor may be configured to be electrically connected to the second power supply and the first node (that is, the storage capacitor may be electrically connected between the second power supply and the first node), and the second node is further configured to be electrically connected to the third node. It may be figured out that a voltage of the second node may be equal to a voltage of the third node.

Based on the foregoing electrical connection relationships, the following may be further obtained:

The storage capacitor may be configured to store, by using the first transistor, a first voltage provided by the first power supply.

It should be noted that because a second voltage provided by the second power supply may be a direct current voltage, and the storage capacitor has a function of blocking the direct current voltage, in a process in which the drive circuit drives the light-emitting diode, the second voltage is blocked by the storage capacitor, and the second voltage does not affect a voltage of the first node.

The first transistor may be configured to control the voltage of the third node based on the first voltage stored by the storage capacitor and the second voltage provided by the second power supply.

The second transistor may be configured to control a drive current of the light-emitting diode based on a light emission control signal provided by the light emission control circuit and the voltage of the third node.

The third transistor may be configured to control a control electrode voltage of the first transistor based on a first control signal provided by the first control circuit and the voltage of the second node. The third transistor may be further configured to compensate for a threshold voltage of the first transistor based on the first control signal and the first voltage provided by the first power supply.

The fourth transistor may be configured to control the voltage of the second node based on a second control signal provided by the second control circuit and a third voltage provided by the third power supply.

In the drive circuit provided in this application, a control electrode of a transistor T1 used as the drive transistor is electrically connected to a node N1, and a control electrode of a transistor T3 used as the switching transistor is connected to the first control circuit C1. In this case, a change in a control electrode voltage of the transistor T3 does not couple the control electrode voltage of the transistor T1, so that a forward gamma voltage of the light-emitting diode is reduced, and brightness of the light-emitting diode is enhanced, thereby reducing power consumption of the drive circuit.

In an example, in one image refresh period, a quantity of drive pulses in the first control signal is greater than or equal to a quantity of drive pulses in the second control signal.

In other words, in one image refresh period, a quantity of switch-on times of the third transistor may be greater than or equal to a quantity of switch-on times of the fourth transistor. If the quantity of switch-on times of the third transistor is equal to the quantity of switch-on times of the fourth transistor, compensation for the threshold voltage of the first transistor may be implemented as soon as possible in the image refresh period.

In another example, in one image refresh period, a quantity of drive pulses in the light emission control signal may be greater than or equal to 2.

In a possible implementation, the drive circuit provided in this application may further include a fifth transistor and a sixth transistor.

A first electrode of the fifth transistor may be configured to be electrically connected to the second power supply, a control electrode of the fifth transistor may be configured to be electrically connected to the light emission control circuit, and a second electrode of the fifth transistor may be configured to be electrically connected to a fourth node.

A first electrode of the sixth transistor may be configured to be electrically connected to the first power supply, a control electrode of the sixth transistor may be configured to be electrically connected to a third control circuit, a second electrode of the sixth transistor may be configured to be electrically connected to the fourth node, and the fourth node is further configured to be electrically connected to the first transistor.

Based on the foregoing electrical connection relationships, the following may be further obtained:

The fifth transistor may be configured to control a voltage of the fourth node based on the light emission control signal and the second voltage.

The sixth transistor may be configured to control the voltage of the fourth node based on a third control signal provided by the third control circuit and the first voltage.

In some embodiments of this application, in one image refresh period, a frequency of a drive pulse in the third control signal may be equal to an image refresh frequency.

It may be understood that, although both the fifth transistor and the sixth transistor are configured to control the voltage of the fourth node, the fifth transistor and the sixth transistor are not switched on at the same time. When the fifth transistor may be in an on state, the voltage of the fourth node may be equal to the second voltage. When the sixth transistor may be in an on state, the voltage of the fourth node may be equal to the first voltage.

Therefore, the first transistor may be specifically configured to control the voltage of the third node based on the voltage of the fourth node and the control electrode voltage of the first transistor.

Further, the drive circuit provided in this application may further include a seventh transistor and an eighth transistor.

A first electrode of the seventh transistor may be configured to be electrically connected to an anode of the light-emitting diode, a second electrode of the seventh transistor may be configured to be electrically connected to a fifth power supply, a first electrode of the eighth transistor may be configured to be electrically connected to the third node, and a second electrode of the eighth transistor may be configured to be electrically connected to a sixth power supply.

A control electrode of the seventh transistor and a control electrode of the eighth transistor each may be configured to be electrically connected to a fourth control circuit, or the control electrode of the seventh transistor may be configured to be electrically connected to a fifth control circuit, and the control electrode of the eighth transistor may be configured to be electrically connected to the fourth control circuit.

In other words, the control electrode of the seventh transistor and the control electrode of the eighth transistor may be configured to be electrically connected to a same control circuit, or may be respectively connected to different control circuits.

Based on the foregoing electrical connection relationships, the following may be further obtained:

The seventh transistor may be configured to control an anode voltage of the light-emitting diode based on a fourth control signal provided by the fourth control circuit and a fifth voltage provided by the fifth power supply. Alternatively, the seventh transistor may be configured to control the anode voltage of the light-emitting diode based on a fifth control signal provided by the fifth control circuit and the fifth voltage.

The eighth transistor may be configured to control the voltage of the third node based on the fourth control signal and a sixth voltage provided by the sixth power supply.

It can be seen that the anode voltage of the light-emitting diode may be controlled by using the seventh transistor, that is, the anode voltage of the light-emitting diode may be reset. The voltage of the third node may be controlled by using the eighth transistor, that is, the voltage of the third node may be reset.

In this embodiment of this application, when the eighth transistor is in an on state, the voltage of the third node may be controlled based on the sixth voltage, so that a source voltage and a drain voltage of the first transistor are controllable (which may also be understood as reset). This can enhance negative bias temperature stress of the first transistor, that is, control drift of the threshold voltage of the first transistor. In this way, flickering of a display screen can be avoided in a process of switching between different image refresh frequencies of the display device and at a low image refresh frequency.

In a possible implementation, in one image refresh period, a quantity of drive pulses in the fourth control signal may be greater than or equal to the quantity of drive pulses in the light emission control signal, and a frequency of a drive pulse in the fifth control signal may be equal to the image refresh frequency.

It may be figured out that, because the frequency of the drive pulse in the third control signal may be equal to the image refresh frequency, the frequency of the drive pulse in the fifth control signal may be equal to the frequency of the drive pulse in the third control signal, and both are equal to the image refresh frequency.

In some embodiments of this application, a frequency of the drive pulse in the fourth control signal may be N/2 times the frequency of the drive pulse in the third control signal. N≥2, and N is an integer.

For example, when a frequency of a drive pulse in a control signal S4$n$ is 60 Hz, a frequency of a drive pulse in a control signal S3$n$ may be 60 Hz, 40 Hz, 30 Hz, 24 Hz, and the like.

For another example, when the frequency of the drive pulse in the control signal S4$n$ is 120 Hz, the frequency of the drive pulse in the control signal S3$n$ may be 120 Hz, 80 Hz, 60 Hz, and the like.

It may be figured out that the fourth control signal and the third control signal may use different timings. The drive pulse in the fourth control signal may be at a high frequency such as 360 Hz. Because the frequency of the drive pulse in the third control signal may be the image refresh frequency, different image refresh frequencies such as 120 Hz, 90 Hz, and 72 Hz may be implemented. This can not only implement dynamic switching between different image refresh frequencies, but also can avoid screen flickering during switching between different image refresh frequencies or maintaining a picture at a low refresh frequency, thereby improving stability of a displayed image.

In a possible implementation, the first transistor, the second transistor, the fifth transistor, and the sixth transistor each may be a low-temperature polycrystalline silicon thin-film transistor. The third transistor and the fourth transistor each may be an oxide thin-film transistor.

Further, in an example, the seventh transistor and the eighth transistor each may be a low-temperature polycrystalline silicon thin-film transistor.

In some embodiments of this application, a falling edge of a first drive pulse in the fourth control signal may be after a rising edge of a first drive pulse in the light emission control signal. A falling edge of a last drive pulse in the fourth control signal may be after a falling edge of a last drive pulse in the first control signal. A rising edge of the last drive pulse in the fourth control signal may be before a falling edge of the first drive pulse in the light emission control signal.

In some embodiments of this application, a falling edge of the drive pulse in the fifth control signal may be before the falling edge of the last drive pulse in the fourth control signal, and a rising edge of the drive pulse in the fifth control signal may be after the rising edge of the last drive pulse in the fourth control signal.

It may be figured out that the seventh transistor and the eighth transistor each are a low-temperature polycrystalline silicon thin-film transistor. Therefore, the drive circuit provided in this application may be used in a dynamic display device with a high image refresh frequency, such as a mobile phone or a tablet computer.

In another example, the seventh transistor and the eighth transistor each may be an oxide thin-film transistor.

In some embodiments of this application, a rising edge of a first drive pulse in the fourth control signal may be after a rising edge of a first drive pulse in the light emission control signal. A rising edge of a last drive pulse in the fourth control signal may be after a falling edge of a last drive pulse in the first control signal. A falling edge of the last drive pulse in the fourth control signal is before a falling edge of the first drive pulse in the light emission control signal.

In some embodiments of this application, a rising edge of the drive pulse in the fifth control signal may be before the rising edge of the last drive pulse in the fourth control signal. A falling edge of the drive pulse in the fifth control signal may be after the falling edge of the last drive pulse in the fourth control signal.

It may be figured out that the seventh transistor and the eighth transistor each are an oxide thin-film transistor. Therefore, the seventh transistor and the eighth transistor may be suitable for use in a static display device with a low image refresh frequency, such as a watch or an e-book reader.

In this application, the control timing of each control signal in the foregoing two examples may be used to control a drive current of the light-emitting diode, that is, drive the light-emitting diode, so that the light-emitting diode emits light.

In a possible implementation, a rising edge of the drive pulse in the third control signal may be before the falling edge of the last drive pulse in the first control signal.

In some embodiments of this application, quantities of respective drive pulses of the first control signal, the second control signal, the third control signal, and the fifth control signal each are in a high-level period of the first drive pulse in the light emission control signal.

According to a second aspect, this application provides a display device, and the display device may include a first power supply, a second power supply, a third power supply, a light emission control circuit, a first control circuit, a second control circuit, a plurality of light-emitting diodes, and a plurality of drive circuits provided in the first aspect and the possible implementations of the first aspect.

The first power supply, the second power supply, the third power supply, the light emission control circuit, the first control circuit, and the second control circuit each may be configured to be electrically connected to each of the plurality of drive circuits, and the plurality of light-emitting diodes may be configured to be electrically connected to the plurality of drive circuits in a one-to-one correspondence.

Therefore, each drive circuit may be configured to control a drive current of a corresponding light-emitting diode, to drive the light-emitting diode.

It may be figured out that each drive circuit may compensate for a threshold voltage of a first transistor based on a third transistor, and different drive circuits may eliminate a difference between turn-on voltages of corresponding light-emitting diodes, so that display luminance of the display device is even, that is, display luminance is consistent as much as possible.

It should be understood that technical solutions in the second aspect of this application are consistent with those in the first aspect of this application, and beneficial effects achieved by the aspects and the corresponding feasible implementations are similar. Details are not described again.

DETAILED DESCRIPTION OF ILLUSTRATIVE EMBODIMENTS

The following describes technical solutions of this application with reference to accompanying drawings.

In the specification, embodiments, claims, and accompanying drawings of this application, the terms such as "first" and "second" are merely intended for distinguishing between descriptions, and cannot be understood as an indication or implication of relative importance, or cannot be understood as an indication or implication of an order. In addition, the terms "include", "have", and any variant thereof are intended to cover a non-exclusive inclusion, for example, include a series of steps or units. Methods, systems, products, or devices are not necessarily limited to those steps or units that are explicitly listed, but may include other steps or units that are not explicitly listed or that are inherent to such processes, methods, products, or devices.

It should be understood that in this application, "at least one" means one or more, and "a plurality of" means two or more. The term "and/or" is used for describing an association relationship between associated objects, and represents that three relationships may exist. For example, "A and/or B" may represent the following three cases: Only A exists, only B exists, and both A and B exist, where A and B may be singular or plural. The character "/" generally indicates an "or" relationship between the associated objects. "At least one of the following" or similar expressions refer to any combination of these items, including any combination of single items or a plurality of items. For example, at least one of a, b, or c may indicate a, b, c, a and b, a and c, b and c, or a, b, and c, where a, b, and c may be singular or plural.

With rapid development of science and technology, semiconductor devices (such as transistors) have been widely used in display devices. Based on an application scenario of a display device, the display device may be classified into a dynamic display device (for example, a device primarily designed for dynamic display such as a mobile phone, a notebook computer, or a tablet computer) and a static display device (for example, a device primarily designed for static display such as a watch, an e-book reader, an electronic billboard, or a wall-mounted window). In contrast, a dynamic device requires a high image refresh frequency, while a static device requires a low image refresh frequency. An image refresh frequency refers to a quantity of times that an electronic beam repeatedly scans an image on a display screen. A higher image refresh frequency indicates better stability of a displayed image or picture.

Figure 1:
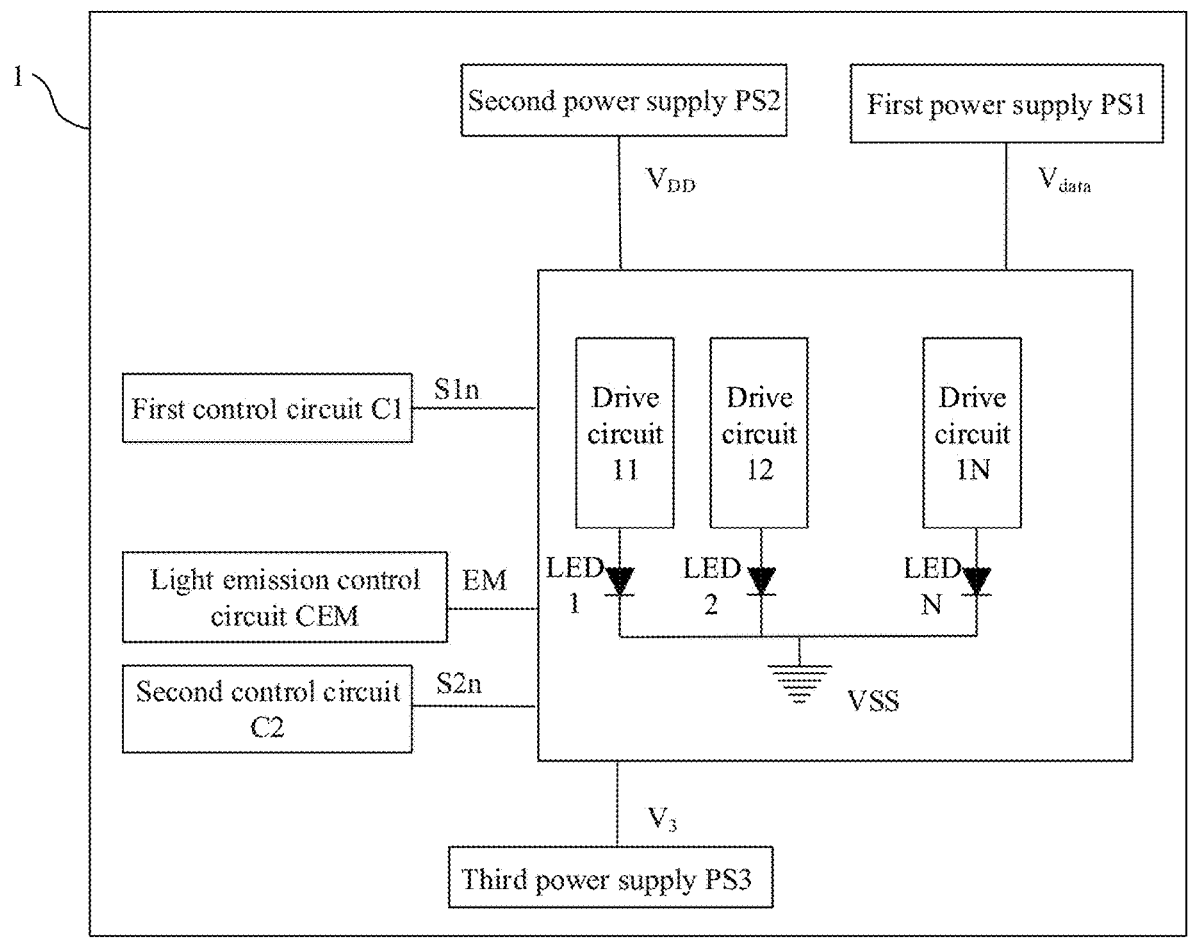
FIG. 1 is a diagram of a structure of a display device according to an embodiment of this application.

To meet requirements for the image refresh frequency of different display devices, an embodiment of this application provides a display device, as shown in FIG. 1. A display device 1 may include a first power supply (PS) PS1, a third power supply PS3, a second power supply PS2, a light emission control circuit CEM, a first control circuit C1, a second control circuit C2, N drive circuits, and N light-emitting diodes (LEDs), as shown in FIG. 1. The N drive circuits may include a drive circuit 11, a drive circuit 12, . . . , and a drive circuit 1N. The N light-emitting diodes may include an LED 1, an LED 2, . . . , and an LED N.

The N drive circuits may be electrically connected to the N light-emitting diodes in a one-to-one correspondence.

For example, the drive circuit 11 may be correspondingly electrically connected to an anode of the LED 1.

For another example, the drive circuit 12 may be correspondingly electrically connected to an anode of the LED 2.

For still another example, the drive circuit 1N may be correspondingly electrically connected to an anode of the LED N.

For example, respective cathodes of the LED 1 to the LED N may be connected to a common ground terminal VSS.

In some embodiments of this application, the power supply PS1, the power supply PS2, the power supply PS3, the light emission control circuit CEM, the control circuit C1, and the control circuit C2 each may be configured to be electrically connected to each drive circuit (as illustrated in FIG. 1).

Based on the foregoing electrical connection relationships, the following may be determined:

The first power supply PS1 may be configured to provide a first voltage $V_{data}$ (which may be understood as a data voltage) for each drive circuit.

The second power supply PS2 may be configured to provide a second voltage $V_{DD}$ (which may be understood as an operating voltage) for each drive circuit.

The third power supply PS3 may be configured to provide a third voltage $V_3$ (which may be understood as an initialization voltage) for each drive circuit.

The light emission control circuit CEM may be configured to provide a light emission control signal EM (which may be represented by a logical level) for each drive circuit.

The first control circuit C1 may be configured to provide a control signal S1$n$ (which may be represented by a logical level) for each drive circuit.

The second control circuit C2 may be configured to provide a control signal S2$n$ (which may be represented by a logical level) for each drive circuit.

Therefore, the drive circuit 11 may be configured to control a drive current of the LED 1, that is, drive the LED 1 to emit light, based on the first voltage $V_{data}$, the second voltage $V_{DD}$, the third voltage $V_3$, the light emission control signal EM, the control signal S1$n$, and the control signal S2$n$.

Similarly, the drive circuit 12 may be configured to control a drive current of the LED 2, that is, drive the LED 2 to emit light, based on the first voltage $V_{data}$, the second voltage $V_{DD}$, the third voltage $V_3$, the light emission control signal EM, the control signal S1$n$, and the control signal S2$n$.

The drive circuit 1N may be configured to control a drive current of the LED N, that is, drive the LED N to emit light, based on the first voltage $V_{data}$, the second voltage $V_{DD}$, the third voltage $V_3$, the light emission control signal EM, the control signal S1$n$, and the control signal S2$n$.

Figure 2:
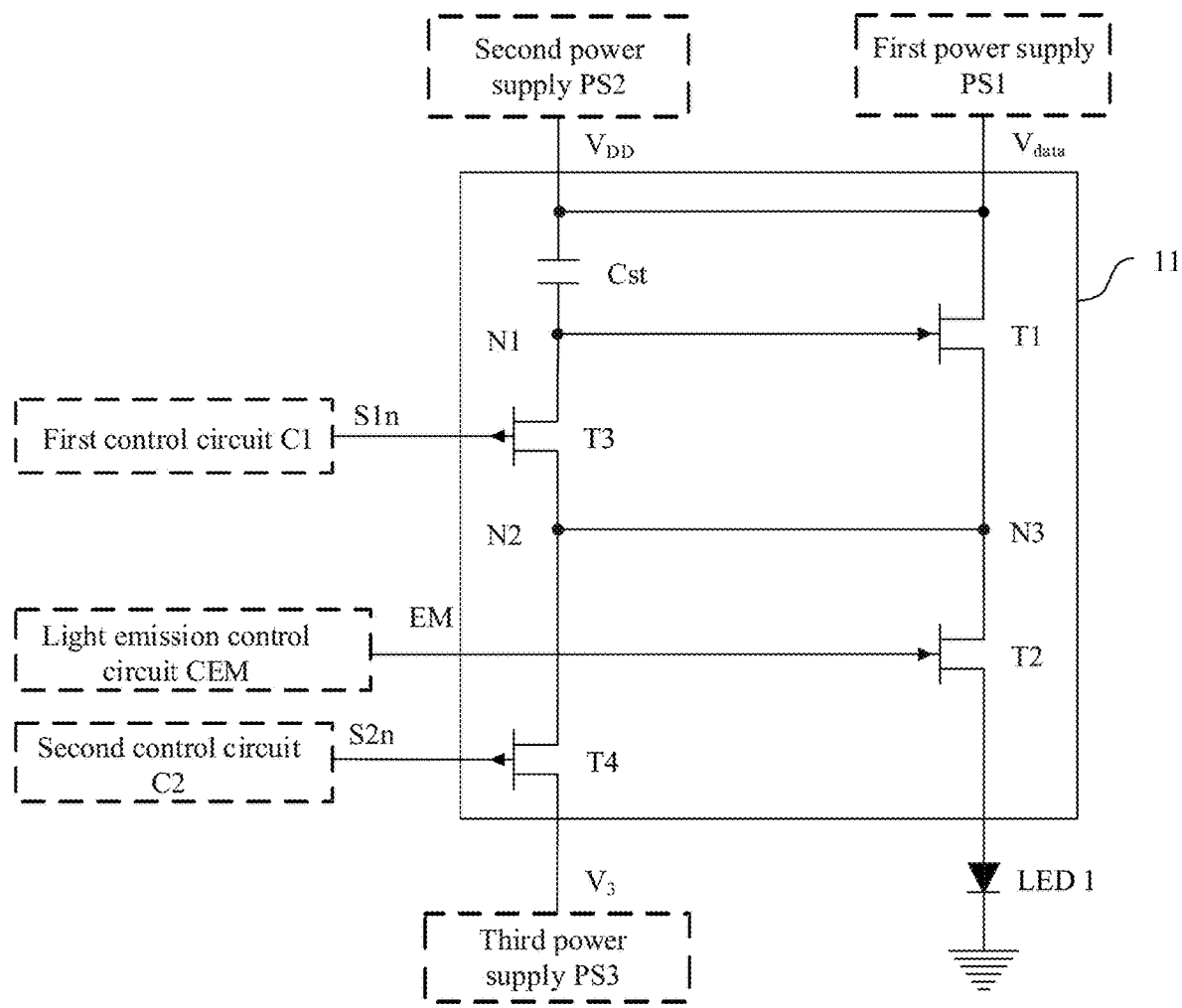
FIG. 2 is a schematic of a structure of a drive circuit according to an embodiment of this application.

Further, as shown in FIG. 2, each drive circuit (using the drive circuit 11 as an example) may include a transistor T1 (that is, a first transistor, which is used as a drive transistor), a transistor T2 (that is, a second transistor, which is used as a switching transistor), a transistor T3 (that is, a third transistor, which is used as a switching transistor), a transistor T4 (that is, a fourth transistor, which is used as a switching transistor), and a storage capacitor Cst.

In some embodiments of this application, the transistor T1 may be configured to be electrically connected to the first power supply PS1, the second power supply PS2, a node N1 (that is, a first node), and a node N3 (that is, a third node). Specifically, a first electrode (which may be a source) of the transistor T1 may be configured to be electrically connected to the first power supply PS1, a control electrode (which may be a gate) of the transistor T1 may be configured to be electrically connected to the node N1 (a gate voltage of the transistor T1 may be equal to a voltage of the node N1), and a second electrode (which may be a drain) of the transistor T1 may be configured to be electrically connected to the node N3.

The transistor T2 may be configured to be electrically connected to the node N3, the light emission control circuit CEM, and the LED 1. Specifically, a first electrode (which may be a source) of the transistor T2 may be configured to be electrically connected to the node N3, and a control electrode (which may be a gate) of the transistor T2 may be configured to be electrically connected to the light emission control circuit CEM. A second electrode (which may be a drain) of the transistor T2 may be configured to be electrically connected to the anode of the LED 1, and a cathode of the LED 1 may be configured to be electrically connected to the common ground terminal VSS.

The transistor T3 may be configured to be electrically connected to the node N1, the first control circuit C1, and a node N2 (that is, a second node). Specifically, a first electrode (which may be a drain) of the transistor T3 may be configured to be electrically connected to the node N1, the control electrode (which may be a gate) of the transistor T2 may be configured to be electrically connected to the first control circuit C1, and the second electrode (which may be a source) of the transistor T2 may be configured to be electrically connected to the node N2.

The transistor T4 may be configured to be electrically connected to the node N2, the second control circuit C2, and the third power supply PS3. Specifically, a first electrode (which may be a drain) of the transistor T4 may be configured to be electrically connected to the node N2, a control electrode (which may be a gate) of the transistor T4 may be configured to be electrically connected to the second control circuit C2, and a second electrode (which may be a source) of the transistor T4 may be configured to be electrically connected to the third power supply PS3.

The storage capacitor Cst may be configured to be electrically connected to the second power supply PS2 and the node N1 (that is, the storage capacitor Cst may be electrically connected between the second power supply PS2 and the node N1). Because the second voltage $V_{DD}$ may be a direct current voltage, and the storage capacitor Cst has a function of blocking the direct current voltage, in a process in which the drive circuit 11 drives the LED 1, the second voltage $V_{DD}$ is blocked by the storage capacitor Cst, and the second voltage $V_{DD}$ does not affect the voltage of the node N1.

In some other embodiments, the node N2 may be further configured to be electrically connected to the node N3. In this case, a voltage of the node N2 may be equal to a voltage of the node N3.

For example, the transistor T1, the transistor T2, the transistor T3, and the transistor T4 may be an organic thin-film transistor, or the transistor T1, the transistor T2, the transistor T3, and the transistor T4 may be an inorganic thin-film transistor.

In some other embodiments, the transistor T1 and the transistor T2 each may be a low-temperature polycrystalline silicon thin-film transistor (LTPS TFT), which is referred to as an LTPS transistor for short. Certainly, the transistor T1 and the transistor T2 may alternatively be transistors of other types. This is not limited in this embodiment of this application.

The transistor T3 and the transistor T4 each may be an oxide thin-film transistor (oxide TFT). Certainly, the transistor T3 and the transistor T4 may alternatively be transistors of other types. This is not limited in this embodiment of this application.

Based on the foregoing electrical connection relationships, the following may be further obtained:

The storage capacitor Cst may be configured to store the first voltage $V_{data}$ by using the transistor T1.

It may be understood that, in a process in which the storage capacitor Cst stores the first voltage $V_{data}$, the transistor T1 is in an on state.

The transistor T1 may be configured to control the voltage of the node N3 based on the first voltage $V_{data}$ stored by the storage capacitor Cst and the second voltage $V_{DD}$.

It may be understood that, because the transistor T1 is a drive transistor, the transistor T2 is a switching transistor, and the node N3 is electrically connected to the transistor T1 and the transistor T2. In this case, when the transistor T2 is in an on state, the transistor T1 controls the voltage of the node N3, that is, controls an anode voltage of the LED 1.

The transistor T2 may be configured to control the drive current of the LED 1 based on the light emission control signal EM and the voltage of the node N3.

It may be understood that, because the transistor T2 may be an LTPS transistor, in a case in which the light emission control signal EM is at a low level, the transistor T2 is in an on state; and in a case in which the light emission control signal EM is at a high level, the transistor T2 is in an off state. In this case, when the transistor T2 is in an on state, a current (which may be represented by $I_{ds}$) between the drain and the source of the transistor T1 may be the drive current of the LED 1.

The transistor T4 may be configured to control the voltage of the node N2 based on the second control signal S2n and the third voltage $V_3$.

It may be understood that, because the transistor T4 may be an oxide thin-film transistor, in a case in which the control signal S2n is at a high level, the transistor T4 is in an on state; and in a case in which the control signal S2n is at a low level, the transistor T4 is in an off state. In this case, when the transistor T4 is in an on state, the voltage of the node N2 may be equal to the third voltage $V_3$.

It may be further understood that, because the voltage of the node N2 may be equal to the voltage of the node N3, and the transistor T1 and the transistor T4 are not in an on state at the same time, the voltage of the node N2 may be controlled by the transistor T1, or may be controlled by the transistor T4.

The transistor T3 may be configured to: control a control electrode voltage (that is, a gate voltage, which may be represented by $V_g$) of the transistor T1 based on the control signal S1n and the voltage of the node N2, and compensate for a threshold voltage (the threshold voltage of the transistor T1 compensated for by the transistor T3 may be represented by $V_{th1}$) of the transistor T1 based on the control signal S1n and the first voltage $V_{data}$.

Specifically, because the transistor T3 may be an oxide thin-film transistor, in a case in which the control signal S1n is at a high level, the transistor T3 is in an on state; and in a case in which the control signal S1n is at a low level, the transistor T3 is in an off state. When the transistor T3 is in an on state, the voltage of the node N2 may be equal to the voltage of the node N1. Therefore, a function of the transistor T3 may be divided into the following two aspects.

In one aspect, when both the transistor T3 and the transistor T4 are in an on state, the third voltage $V_3$ may be used to control the voltage of the node N1, that is, control the control electrode voltage $V_g$ of the transistor T1.

In this case, a process of controlling the control electrode voltage $V_g$ of the transistor T1 by using the transistor T3 and the transistor T4 may be understood as an initialization phase t2 of the drive circuit 11 (referring to the following descriptions).

It may be understood that the transistor T3 and the transistor T4 are in an on state only in a process of controlling the control electrode voltage $V_g$ of the transistor T1.

In another aspect, when the transistor T3 is in an on state and the transistor T4 is in an off state, the transistor T3 may compensate for the threshold voltage of the transistor T1 based on the first voltage $V_{data}$.

In an example, the current $I_{ds}$ between the drain and the source of the transistor T1 may be expressed by using the following formula (1):

$$I_{ds} = k(V_{gs} - V_{th2})^2$$

In formula (1), k is a coefficient, $V_{gs}$ represents a voltage between the gate and the source of the transistor T1, and $V_{th2}$ represents the threshold voltage of the transistor T1 (that is, a turn-on voltage of the transistor T1).

Because $V_{gs}=V_g-V_s$, and $V_g=V_{data}+V_{th1}$, there may be the following formula (2):

$$I_{ds} = k(V_{gs} - V_{th2})^2 = k(V_{data} + V_{th1} - V_{DD} - V_{th2})^2$$

In addition, because a threshold voltage $V_{th1}$ of the transistor T1 compensated for by the transistor T3 may be offset against the turn-on voltage $V_{th2}$ of the transistor T1, there may be the following formula (3):

$$I_{ds} = k(V_{data} - V_{DD})^2$$

It can be seen from formula (3) that the turn-on voltage $V_{th2}$ of the transistor T1 does not affect the current $I_d$ between the drain and the source of the transistor T1. In other words, the turn-on voltage $V_{th2}$ of the transistor T1 does not affect the drive current of the LED 1.

It can be seen from a function of the transistor T3 that each drive circuit may compensate for a threshold voltage of an internal transistor T1 based on an internal transistor T3, and different drive circuits may eliminate a difference between turn-on voltages of corresponding LEDs, so that display luminance of the display device is even, that is, display luminance is consistent as much as possible.

In the drive circuit provided in this application, the control electrode of the transistor T1 used as the drive transistor is electrically connected to the node N1, and the control electrode of the transistor T3 used as the switching transistor is connected to the first control circuit C1. In this case, a change in a control electrode voltage of the transistor T3 does not couple the control electrode voltage of the transistor T1, so that a forward gamma voltage of the light-emitting diode is reduced, and brightness of the light-emitting diode is enhanced, thereby reducing power consumption of the drive circuit.

In addition, because the oxide thin-film transistor features a low leakage current, and the LTPS transistor features a high electron mobility, the drive circuit provided in this embodiment of this application combines the oxide thin-film transistor and the LTPS transistor, so that more levels of image refresh frequencies can be supported at the same time, and seamless switching between different image refresh frequencies is implemented.

Figure 3:
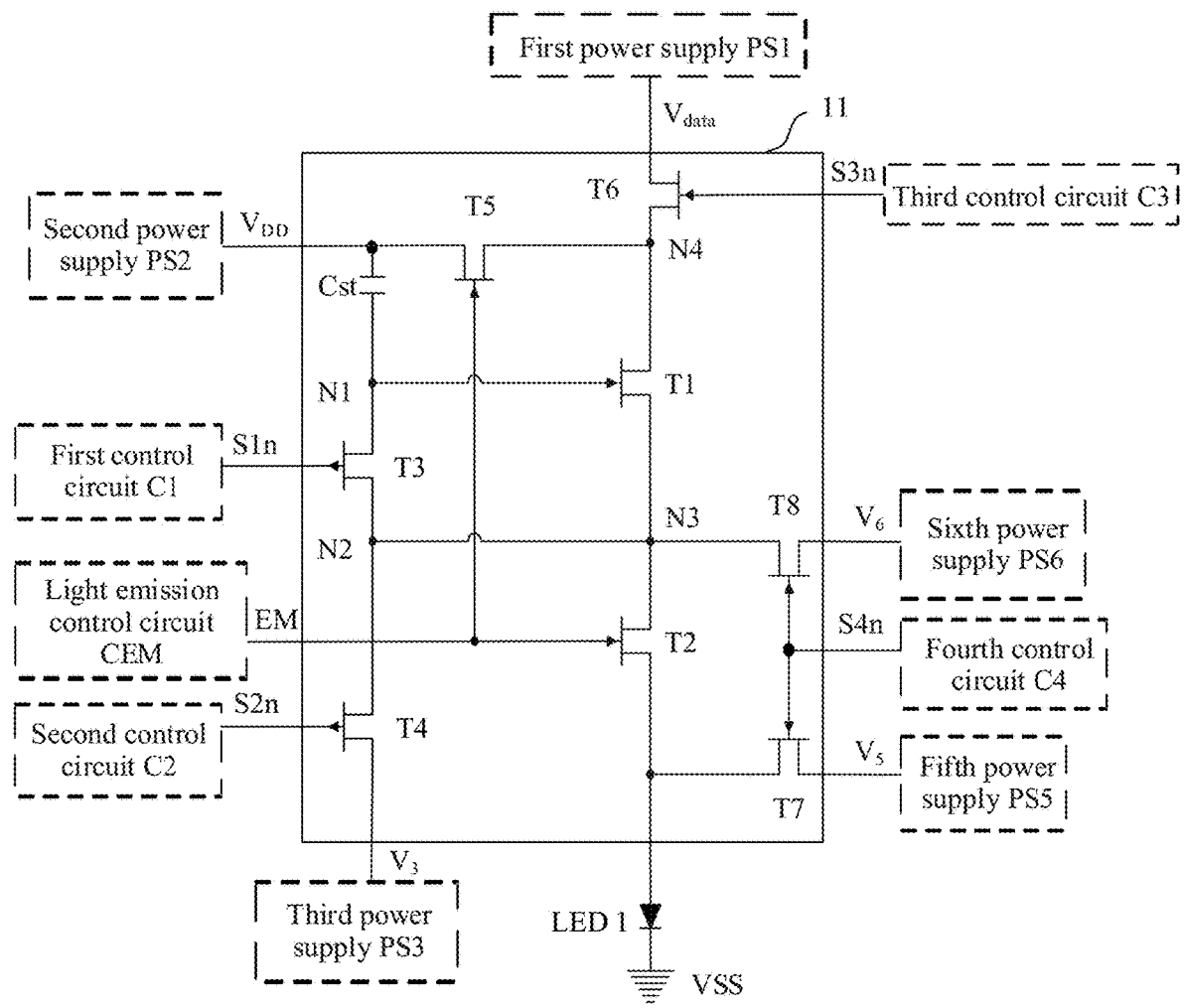
FIG. 3 is a schematic of a structure of a drive circuit according to an embodiment of this application.

In a possible implementation, as shown in FIG. 3, the drive circuit 11 may further include a transistor T5 (that is, a fifth transistor, used as a switching transistor) and a transistor T6 (that is, a sixth transistor, used as a switching transistor).

In some embodiments of this application, a first electrode (which may be a source) of the transistor T5 may be configured to be electrically connected to the second power supply PS2, a control electrode (which may be a gate) of the transistor T5 may be configured to be electrically connected to the light emission control circuit CEM, and a second electrode (which may be a drain) of the transistor T5 may be configured to be electrically connected to a node N4 (that is, a fourth node).

A first electrode (which may be a source) of the transistor T6 may be configured to be electrically connected to the first power supply PS1, a control electrode of the transistor T6 may be configured to be electrically connected to a third control circuit C3, a second electrode (which may be a drain) of the transistor T6 may be configured to be electrically connected to the node N4, and the node N4 may be further configured to be electrically connected to the first electrode of the transistor T1.

It can be seen from FIG. 3 that the transistor T5, the transistor T6, and the transistor T1 are electrically connected to the node N4. In other words, the transistor T5 is electrically connected to the transistor T1 by using the node N4. Similarly, the transistor T6 is also electrically connected to the transistor T1 by using the node N4.

In some other embodiments of this application, the transistor T5 and the transistor T6 may be an organic thin-film transistor and an inorganic thin-film transistor, respectively.

Further, the transistor T5 and the transistor T6 each may be an LTPS transistor. Certainly, the transistor T5 and the transistor T6 may alternatively be transistors of other types. This is not limited in this embodiment of this application.

Based on the foregoing electrical connection relationships, the following may be further obtained:

The transistor T5 may be configured to control a voltage of the node N4 based on the light emission control signal EM and the second voltage $V_{DD}$. In other words, when the transistor T5 is in an on state based on the light emission control signal EM, the voltage of the node N4 may be equal to the second voltage $V_{DD}$.

The transistor T6 may be configured to control the voltage of the node N4 based on a third control signal S3n provided by the third control circuit C3 and the first voltage $V_{data}$. In other words, when the transistor T6 is in an on state based on the third control signal S3n, the voltage of the node N4 may be equal to the first voltage $V_{data}$.

It may be understood that, because the transistor T5 and the transistor T6 each may be an LTPS transistor, in a case in which the light emission control signal EM is at a low level, the transistor T5 may be in an on state; and in a case in which the light emission control signal EM is at a high level, the transistor T5 may be in an off state. Similarly, in a case in which the third control signal is at a low level, the transistor T6 may be in an on state; and in a case in which the third control signal is at a high level, the transistor T6 may be in an off state.

It can be learned from the foregoing descriptions that the transistor T3 may compensate for the threshold voltage of the transistor T1 based on the first voltage $V_{data}$. In this case, in a phase (which may be referred to as a threshold compensation phase, for which reference may be made to the following descriptions) in which the transistor T3 compensates for the threshold voltage of the transistor T1, the transistor T3 and the transistor T6 each may be in an on state. It should be noted that the transistor T6 is in an on state in the threshold compensation phase.

It can be seen from the foregoing formula (3) that the drive current of the LED 1 may be related to the second voltage $V_{DD}$. Because the LED 1 emits light only under action of the drive current, in a light emission phase of the LED 1, the transistor T1 and the transistor T2 may be in an on state, the transistor T5 may also be in an on state, and the voltage of the node N4 may be equal to the second voltage $V_{DD}$. Further, the transistor T1 may control the voltage of the node N3 based on the voltage of the node N4 and the control electrode voltage of the transistor T1.

Therefore, it may be understood that, although both the transistor T5 and the transistor T6 are configured to control the voltage of the node N4, the transistor T5 and the transistor T6 are not switched on at the same time. When the transistor T5 may be in an on state, the voltage of the node N4 may be equal to the second voltage $V_{DD}$. When the transistor T6 may be in an on state, the voltage of the node N4 may be equal to the first voltage $V_{data}$.

Further, the drive circuit 11 may further include a transistor T7 (that is, a seventh transistor, used as a switching transistor) and a transistor T8 (that is, an eighth transistor, used as a switching transistor).

In some embodiments of this application, a first electrode (which may be a source) of the transistor T7 is configured to be electrically connected to the anode of the LED 1, and a second electrode (which may be a drain) of the transistor T7 may be configured to be electrically connected to a fifth power supply PS5. A first electrode (which may be a drain) of the transistor T8 may be configured to be electrically connected to a sixth power supply PS6, and a second electrode (which may be a source) of the transistor T8 may be configured to be electrically connected to the node N3.

In a first example, as shown in FIG. 3, a control electrode of the transistor T7 and a control electrode of the transistor T8 each are configured to be electrically connected to a fourth control circuit C4. In other words, respective control electrodes of the transistor T7 and the transistor T8 are connected to a same control circuit (that is, the fourth control circuit C4).

In some embodiments of this application, the transistor T7 and the transistor T8 each may be an LTPS transistor, or the transistor T7 and the transistor T8 each may be an oxide thin-film transistor. Certainly, the transistor T7 and the transistor T8 may alternatively be transistors of other types. This is not limited in this embodiment of this application.

Based on the foregoing electrical connection relationships, the following may be further obtained:

The transistor T7 may be configured to control the anode voltage of the LED 1 based on a fourth control signal S4n provided by the fourth control circuit C4 and a fifth voltage $V_5$ provided by the fifth power supply PS5. In other words, when the transistor T7 is in an on state based on the fourth control signal S4n, the anode voltage of the LED 1 may be equal to the fifth voltage $V_5$.

The transistor T8 may be configured to control the voltage of the node N3 based on the fourth control signal C4 and a sixth voltage $V_6$ provided by the sixth power supply PS6. In other words, when the transistor T8 is in an on state based on the fourth control signal S4n, the voltage of the node N3 may be equal to the sixth voltage $V_6$.

Figure 4:
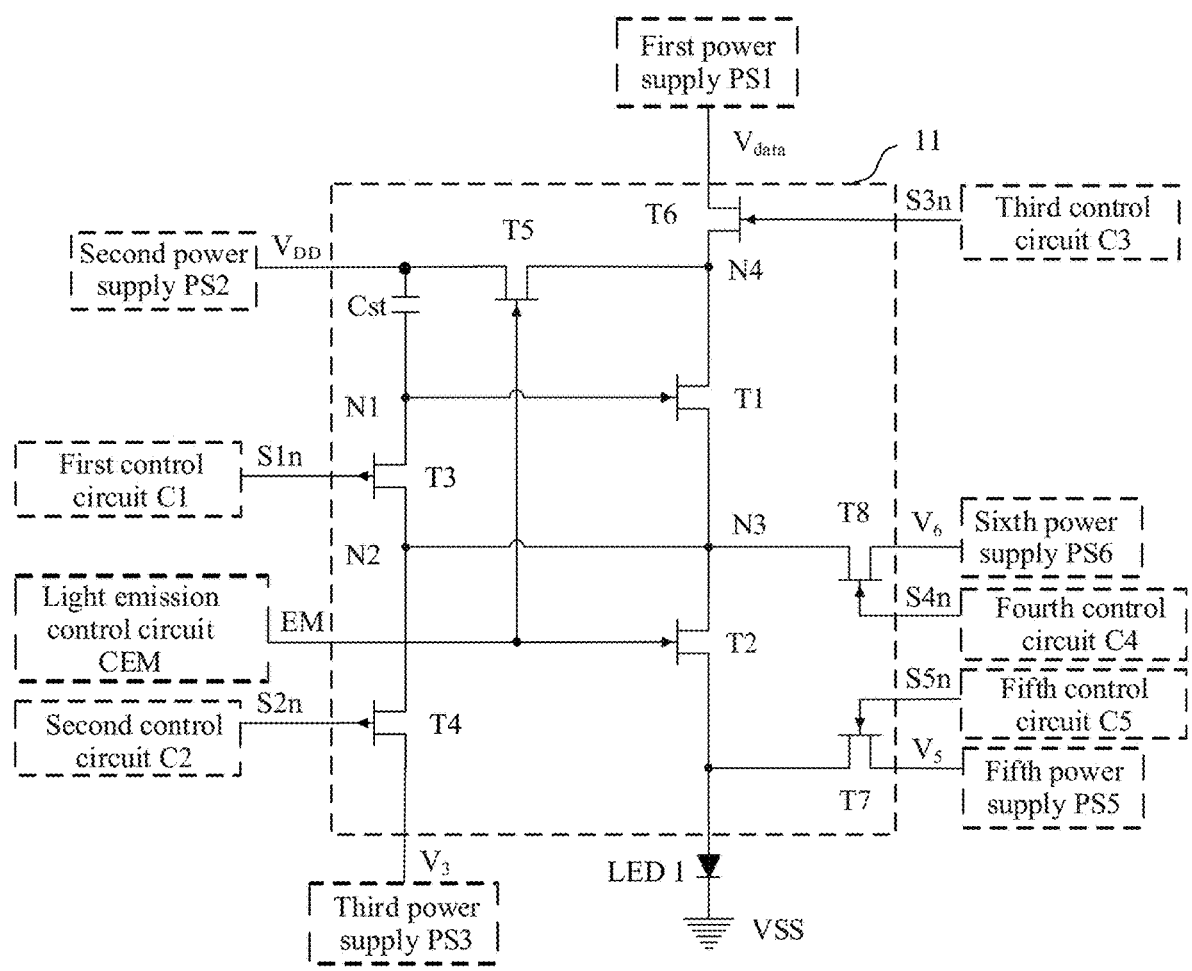
FIG. 4 is a schematic of a structure of a drive circuit according to an embodiment of this application.

In some embodiments of this application, an embodiment of this application provides a second example of the drive circuit 11 (as shown in FIG. 4). A difference from FIG. 3 lies in that the control electrode of the transistor T7 in FIG. 4 may be configured to be electrically connected to a fifth control circuit C5, and the control electrode of the transistor T8 may be configured to be electrically connected to the fourth control circuit C4. In other words, respective control electrodes of the transistor T7 and the transistor T8 may be connected to different control circuits.

Therefore, the transistor T7 may be configured to control the anode voltage of the LED 1 based on a fifth control signal S5n provided by the fifth control circuit C5 and the fifth voltage $V_5$ provided by the fifth power supply PS5. In other words, when the transistor T7 is in an on state based on the fifth control signal S5n, the anode voltage of the LED 1 may be equal to the fifth voltage $V_5$.

In some other embodiments of this application, the transistor T8 may also be configured to control the voltage of the node N3 based on the fourth control signal C4 and the sixth voltage $V_6$ provided by the sixth power supply PS6. In other words, when the transistor T8 is in an on state based on the fourth control signal S4n, the voltage of the node N3 may be equal to the sixth voltage $V_6$.

In this embodiment of this application, when the transistor T8 is in an on state, the voltage of the node N3 may be controlled by using the sixth voltage $V_6$, so that a source voltage (that is, the voltage of the node N4, which may be the sixth voltage $V_6$) and a drain voltage (that is, the voltage of the node N3) of the transistor T1 are controllable (which may also be understood as reset). This can enhance negative bias temperature stress (NBTS) of the transistor T1, that is, control drift of the threshold voltage of the transistor T1. In this way, flickering of the display screen can be avoided in a process of switching between different image refresh frequencies of the display device, and at a low image refresh frequency.

In addition, in this embodiment of this application, the transistor T7 and the transistor T8 each use an oxide thin-film transistor. In a process of controlling the anode voltage of the LED 1 and controlling the source voltage of the transistor T1, respective leakage currents of the transistor T7 and the transistor T8 are reduced, so that the drive circuit 11 can support a low image refresh frequency (for example, ⅟60 Hz). In other words, the drive circuit 11 may be used in a scenario with a low image refresh frequency.

In an example, on a basis that the transistor T1, the transistor T2, the transistor T5, and the transistor T6 each are an LTPS transistor, and the transistor T3 and the transistor T4 each are an oxide thin-film transistor, an example in which the transistor T7 and the transistor T8 each are an LTPS transistor is used to describe a control timing of the drive circuit 11 provided in FIG. 3 in embodiments of this application.

It may be understood that, because the transistor T7 and the transistor T8 each may be an LTPS transistor, for FIG. 3, in a case in which the fourth control signal S4n is at a low level, the transistor T7 and the transistor T8 each may be in an on state; and in a case in which the fourth control signal S4n is at a high level, the transistor T7 and the transistor T8 each may be in an off state.

Similarly, for FIG. 4, in a case in which the fourth control signal S4n is at a low level, the transistor T8 may be in an on state; and in a case in which the fourth control signal S4n is at a high level, the transistor T8 may be in an off state. In a case in which the fifth control signal S5n is at a low level, the transistor T7 may be in an on state; and in a case in which the fifth control signal S5n is at a high level, the transistor T7 may be in an off state.

In a possible implementation, for FIG. 3, an entire process in which the drive circuit 11 drives the LED 1 (that is, the drive circuit 11 controls the drive current of the LED 1) to emit light may be divided into a first initialization phase t1, a second initialization phase t2, a threshold compensation phase t3, a third initialization phase t4, and a light emission phase t5 (only a part of the light emission phase t5 is shown). A specific timing diagram may be shown in FIG. 5.

(1) In the first initialization phase t1, the light emission control signal EM and the control signal S3n each are at a high level, and therefore, the transistor T2, the transistor T5, and the transistor T6 each are switched off. The control signal S1n and the control signal S2n each are at a low level, and the transistor T3 and the transistor T4 each are switched off. The control signal S4n changes from a high level to a low level, and then changes from a low level to a high level. Therefore, the transistor T7 and the transistor T8 each change from being switched off to being switched on, and then change from being switched on to being switched off.

It can be seen that, in the first initialization phase t1, the transistor T7 and the transistor T8 are switched on, so that the voltage of the node N3 is controlled (making the voltage of the node N3 be the sixth voltage $V_6$) and the anode voltage of the LED 1 is controlled (making the anode voltage of the LED 1 be the fifth voltage $V_5$). That is, the voltage of the node N3 and the anode voltage of the LED 1 are reset.

(2) In the second initialization phase t2, the control signal S1n and the control signal S2n each change from a low level to a high level, and then change from a high level to a low level. Therefore, the transistor T3 and the transistor T4 each change from being switched off to being switched on, and then change from being switched on to being switched off. The light emission control signal EM, the control signal S3n, and the control signal S4n each maintain a high level. Therefore, the transistor T2, the transistor T5, the transistor T6, the transistor T7, and the transistor T8 each are switched off.

It can be seen that, in the second initialization phase t2, the transistor T1, the transistor T3, and the transistor T4 each are switched on, so that the voltage of the node N2 and the voltage of the node N1 are controlled. The transistor T3 and the transistor T4 each are used as a switching transistor, the node N1 is electrically connected to the control electrode of the transistor T1, and the node N2 is electrically connected to the node N3. Therefore, the control electrode voltage of the transistor T1, the voltage of the node N1, the voltage of the node N2, and the voltage of the node N3 are controlled (making the control electrode voltage of the transistor T1, the voltage of the node N1, the voltage of the node N2, and the voltage of the node N3 each be the third voltage $V_3$). That is, the control electrode voltage of the transistor T1, the voltage of the node N1, the voltage of the node N2, and the voltage of the node N3 each are reset.

(3) In the threshold compensation phase t3, the control signal S1n changes from a low level to a high level, and then changes from a high level to a low level. Therefore, the transistor T3 changes from being switched off to being switched on, and then changes from being switched on to being switched off. The control signal S3n changes from a high level to a low level, and then changes from a low level to a high level. Therefore, the transistor T6 changes from being switched on to being switched off, and then changes from being switched off to being switched on. The light emission control signal EM and the control signal S4n each maintain a high level, and the control signal S2n maintains a low level. Therefore, the transistor T2, the transistor T4, the transistor T5, the transistor T7, and the transistor T8 each are switched off.

It can be seen that, in the threshold compensation phase t3, the transistor T6, the transistor T3, and the transistor T1 each are switched on, so that the first voltage $V_{data}$ is stored in the storage capacitor Cst, and compensation for the threshold voltage of the transistor T1 is implemented. A process of compensating for the threshold voltage of the transistor T1 may be considered as a process of changing from an on state to an off state of the transistor T1.

(4) In the third initialization phase t4, the control signal S4n changes from a high level to a low level, and then changes from a low level to a high level. Therefore, the transistor T7 and the transistor T8 each change from being switched off to being switched on, and then change from being switched on to being switched off. The light emission control signal EM and the control signal S3n each maintain a high level, and the control signal S1n and the control signal S2n each maintain a low level. Therefore, the transistor T1, the transistor T2, the transistor T3, the transistor T4, the transistor T5, and the transistor T6 each are switched off.

It can be seen that, in the third initialization phase t4, the transistor T7 and the transistor T8 each are switched on, so that the voltage of the node N3 is controlled (making the voltage of the node N3 be the sixth voltage $V_6$) and the anode voltage of the LED 1 is controlled (making the anode voltage of the LED 1 be the fifth voltage $V_5$). That is, the voltage of the node N3 and the anode voltage of the LED 1 are reset.

(5) In the light emission phase t5, the light emission control signal EM changes from a high level to a low level, and the transistor T2 and the transistor T5 each are switched on. The control signal S1n and the control signal S2n each are at a low level, and the transistor T3 and the transistor T4 each are switched off. The control signal S3n and the control signal S4n each are at a high level, and the transistor T6, the transistor T7, and the transistor T8 each are switched off.

It can be seen that, in the light emission phase t5, the transistor T5, the transistor T1, and the transistor T2 each are switched on, so that the drive current of the LED 1 is controlled. That is, the LED 1 is driven to enable the LED 1 to emit light.

Figure 5:
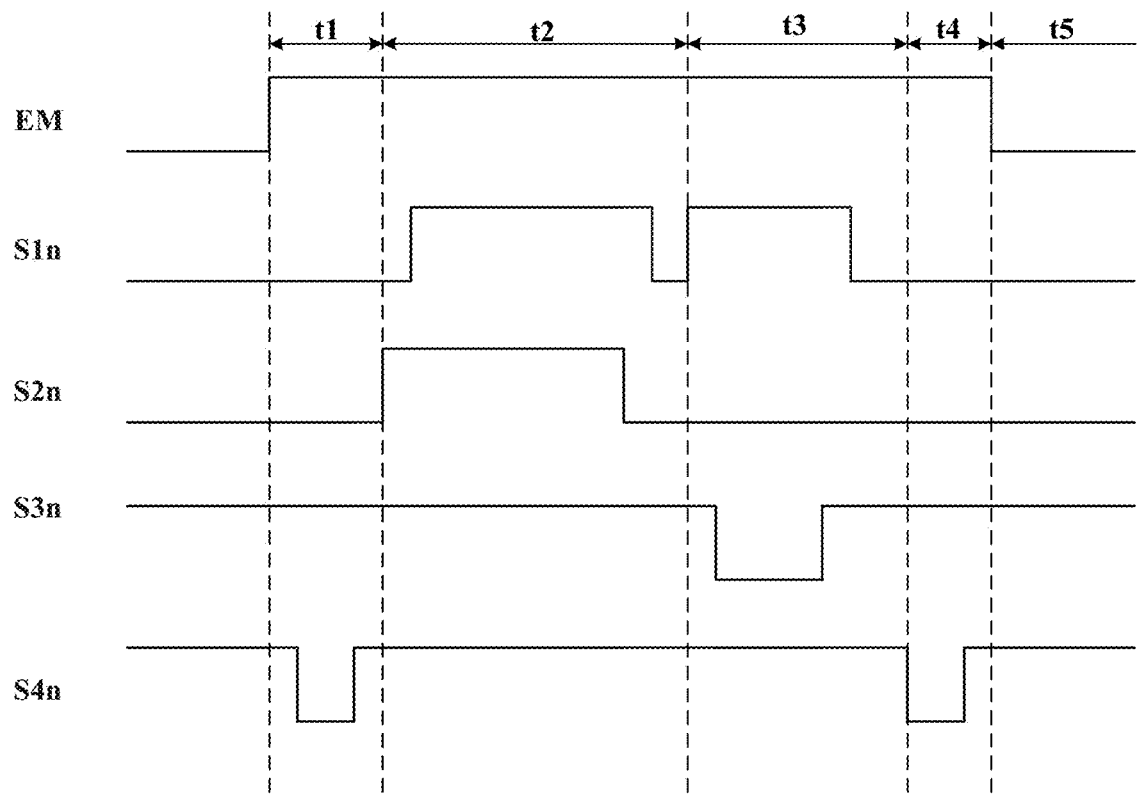
FIG. 5 is a timing diagram of control signals according to an embodiment of this application.

It may be understood from FIG. 5 that, in an entire driving process of the LED 1, the transistor T3 is switched on twice (that is, there are two drive pulses in the control signal S1n), and the transistor T4 is switched on once (that is, there is one drive pulse in the control signal S2n). In this case, it may be figured out that, in one image refresh period (which is a reciprocal of the image refresh frequency, for example, an image refresh period corresponding to an image refresh frequency 120 Hz), a quantity of drive pulses in the control signal S1n may be greater than a quantity of drive pulses in the control signal S2n.

It can be further seen from FIG. 5 that, in an entire driving process, there may be one drive pulse in the control signal S3n. In addition, because the first voltage $V_{data}$ may be a data voltage, it may be figured out that in one image refresh period, a frequency of the drive pulse in the control signal S3n may be equal to the image refresh frequency.

In some embodiments of this application, in an entire driving process, there may be two drive pulses in the control signal S4n, and there may be one drive pulse in the control signal S3n. Therefore, it can be figured out that a frequency of the drive pulse in the control signal S4n may be twice the frequency of the drive pulse in the control signal S3n.

In an embodiment, when the frequency of the drive pulse in the control signal S4n is 60 Hz, the frequency of the drive pulse in the control signal S3n may be 60 Hz, 40 Hz, 30 Hz, 24 Hz, and the like.

In another embodiment, when the frequency of the drive pulse in the control signal S4n is 120 Hz, the frequency of the drive pulse in the control signal S3n may be 120 Hz, 8o Hz, 6o Hz, and the like.

In still another embodiment, when the frequency of the drive pulse in the control signal S4n is 180 Hz, the frequency of the drive pulse in the control signal S3n may be 120 Hz, 90 Hz, 72 Hz, and the like.

In still another embodiment, when the frequency of the drive pulse in the control signal S4n is 240 Hz, the frequency of the drive pulse in the control signal S3n may be 120 Hz, 96 Hz, 8o Hz, and the like.

In still another embodiment, when the frequency of the drive pulse in the control signal S4n is 360 Hz, the frequency of the drive pulse in the control signal S3n may be 144 Hz, 120 Hz, 102.86 Hz, 90 Hz, 8o Hz, and the like.

It can be seen from the foregoing examples that, the frequency of the drive pulse in the control signal S4n may be N/2 times the frequency of the drive pulse in the control signal S3n, where N≥2, and N is an integer.

The control signal S4n and the control signal S3n in embodiments of this application may use different timings. The drive pulse in the control signal S4n may be at a high frequency such as 360 Hz. Because the frequency of the drive pulse in the control signal S3n may be the image refresh frequency, different image refresh frequencies such as 120 Hz, 90 Hz, and 72 Hz may be implemented. This can not only implement dynamic switching between different image refresh frequencies, but also can avoid screen flickering during switching between different image refresh frequencies or maintaining a picture at a low refresh frequency, thereby improving stability of a displayed image.

It can be figured out that, in the entire driving process, there may be a plurality of, such as two or four, drive pulses (referring to the following descriptions) in the light emission control signal EM. Except that the transistor T8 may act in a maintaining process of the light emission phase (that is, change a state, which means that the control signal S4n has a drive pulse in the maintaining process of the light emission phase), other transistors do not change their states in the maintaining process of the light emission phase (that is, the control signal S1n, the control signal S2n, the control signal S3n, and the like do not have a drive pulse in the maintaining process of the light emission phase).

Therefore, it can be seen from FIG. 5 that, a falling edge of a first drive pulse in the control signal S4n may be after a rising edge of a first drive pulse in the light emission control signal EM. In other words, in the image refresh period, the transistor T2 and the transistor T7 are switched off only after the transistor T7 and the transistor T8 are switched on.

A falling edge of a second drive pulse (that is, a last drive pulse in the driving process) in the control signal S4n may be after a falling edge of a second drive pulse (that is, a last drive pulse) in the control signal S1n. In other words, in the image refresh period, the transistor T7 and the transistor T8 each are switched on only after the transistor T3 is switched off for a second time.

A rising edge of the second drive pulse in the control signal S4n may be before a falling edge of the first drive pulse in the light emission control signal EM. In other words, in the image refresh period, the transistor T2 and the transistor T5 each are switched on for a first time only after the transistor T7 and the transistor T8 each are switched off.

It can be further seen from FIG. 5 that, a rising edge of the drive pulse in the control signal S3n may be before the falling edge of the second drive pulse in the control signal S1n. In other words, in the image refresh period, the transistor T3 is switched off only after the transistor T6 is switched off.

Quantities of respective drive pulses of the control signal S1n, the control signal S2n, and the control signal S3n each are in a high-level period of the first drive pulse of the light emission control signal EM. In other words, in one image refresh period, state switching of each of the transistor T3, the transistor T4, the transistor T6, the transistor T7, and the transistor T8 is performed when the transistor T5 and the transistor T2 are in an off state.

Figure 6:
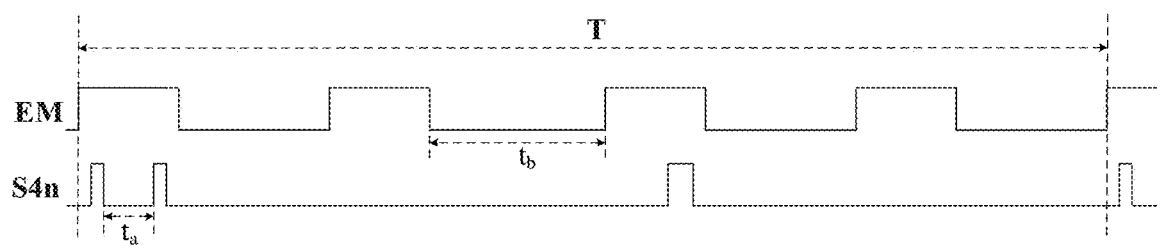
FIG. 6 is a timing diagram of control signals according to an embodiment of this application.

In some embodiments of this application, in one image refresh period, there may be two or more drive pulses of the light emission control signal EM. As shown in FIG. 6, there may be four drive pulses in the light emission control signal EM in one image refresh period (in embodiments of this application, description is provided by using an example in which there may be four drive pulses in the light emission control signal EM in an image refresh period T corresponding to an image refresh frequency 120 Hz).

In FIG. 6, the first drive pulse of the light emission control signal EM corresponds to five phases of the driving process, and a second drive pulse to a fourth drive pulse of the light emission control signal EM correspond to a light emission maintaining phase. There are two drive pulses in the control signal S4n in the high-level period of the first drive pulse of the light emission control signal EM, and there may be one drive pulse in the control signal S4n in a high-level period of a third drive pulse of the light emission control signal EM. In other words, in one image refresh period, there may be three drive pulses in the control signal S4n.

It should be explained that ta in FIG. 6 represents duration of first two drive pulses in the control signal S4n being in a low-level period (corresponding to switch-on duration of the transistor T7 and the transistor T8), and $t_b$ represents duration of drive pulses in the light emission control signal EM being in a low-level period (corresponding to switch-on duration of the transistor T2 and the transistor T5).

It can be further seen from FIG. 6 that, pulse widths of the first two drive pulses in the control signal S4n may be the same, and a pulse width of a third drive pulse may be greater than the pulse widths of the first two drive pulses.

In another embodiment, for FIG. 4, similar to FIG. 5, an entire light emission process in which the drive circuit 11 drives the LED 1 may also be divided into a first initialization phase t1, a second initialization phase t2, a threshold compensation phase t3, a third initialization phase t4, and a light emission phase t5 (only a part of the light emission phase t5 is also shown). A specific timing diagram may be shown in FIG. 7.

In some other embodiments of this application, in the threshold compensation phase t3, a falling edge of a drive pulse in the control signal S5n may be before the falling edge of the second drive pulse in the control signal S4n. A rising edge of the drive pulse in the control signal S5n may be after the rising edge of the second drive pulse in the control signal S4n. In other words, after the transistor T7 is switched on, the transistor T8 may be switched on for a second time. In addition, after the transistor T8 is switched off for the second time, the transistor T7 may be switched off.

Figure 7:
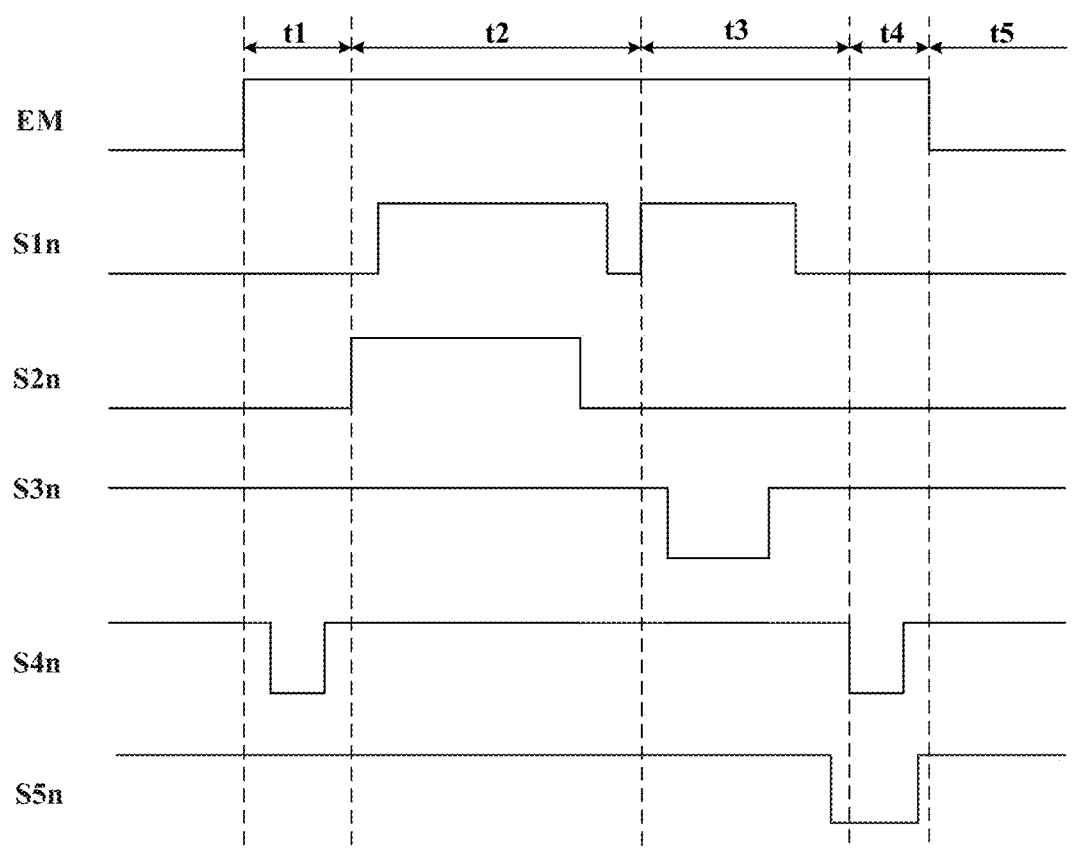
FIG. 7 is a timing diagram of control signals according to an embodiment of this application.

It should be noted that respective timings of the light emission control signal EM, the control signal S1n, the control signal S2n, the control signal S3n, and the control signal S4n in FIG. 7 are the same as respective timings of the light emission control signal EM, the control signal S1n, the control signal S2n, the control signal S3n, and the control signal S4n in FIG. 5. Details are not described in this embodiment of this application.

It should be further noted that, in the drive circuits corresponding to the timing diagrams shown in FIG. 5 to FIG. 7, the transistor T7 and the transistor T8 use LTPS transistors. Therefore, the transistor T7 and the transistor T8 may be suitable for use in a dynamic display device with a high image refresh frequency, such as a mobile phone or a tablet computer.

In another example, on a basis that the transistor T1, the transistor T2, the transistor T5, and the transistor T6 each are an LTPS transistor, and the transistor T3 and the transistor T4 each are an oxide thin-film transistor, an example in which the transistor T7 and the transistor T8 each are an oxide thin-film transistor is used to describe a control timing of the drive circuit 11 provided in FIG. 3 in embodiments of this application.

It may be understood that, because the transistor T7 and the transistor T8 each may be an oxide thin-film transistor, for FIG. 3, in a case in which the fourth control signal S4n is at a low level, the transistor T7 and the transistor T8 each may be in an off state; and in a case in which the fourth control signal S4n is at a high level, the transistor T7 and the transistor T8 each may be in an on state.

Similarly, for FIG. 4, in a case in which the fourth control signal S4n is at a low level, the transistor T8 may be in an off state; and in a case in which the fourth control signal S4n is at a high level, the transistor T8 may be in an on state. In a case in which the fifth control signal S5n is at a low level, the transistor T7 may be in an off state; and in a case in which the fifth control signal S5n is at a high level, the transistor T7 may be in an on state.

In a possible implementation, for FIG. 3, similar to FIG. 5 and FIG. 7, an entire light emission process in which the drive circuit 11 drives the LED 1 may also be divided into a first initialization phase t1, a second initialization phase t2, a threshold compensation phase t3, a third initialization phase t4, and a light emission phase t5 (only a part of the light emission phase t5 is also shown). A specific timing diagram may be shown in FIG. 8.

Figure 8:
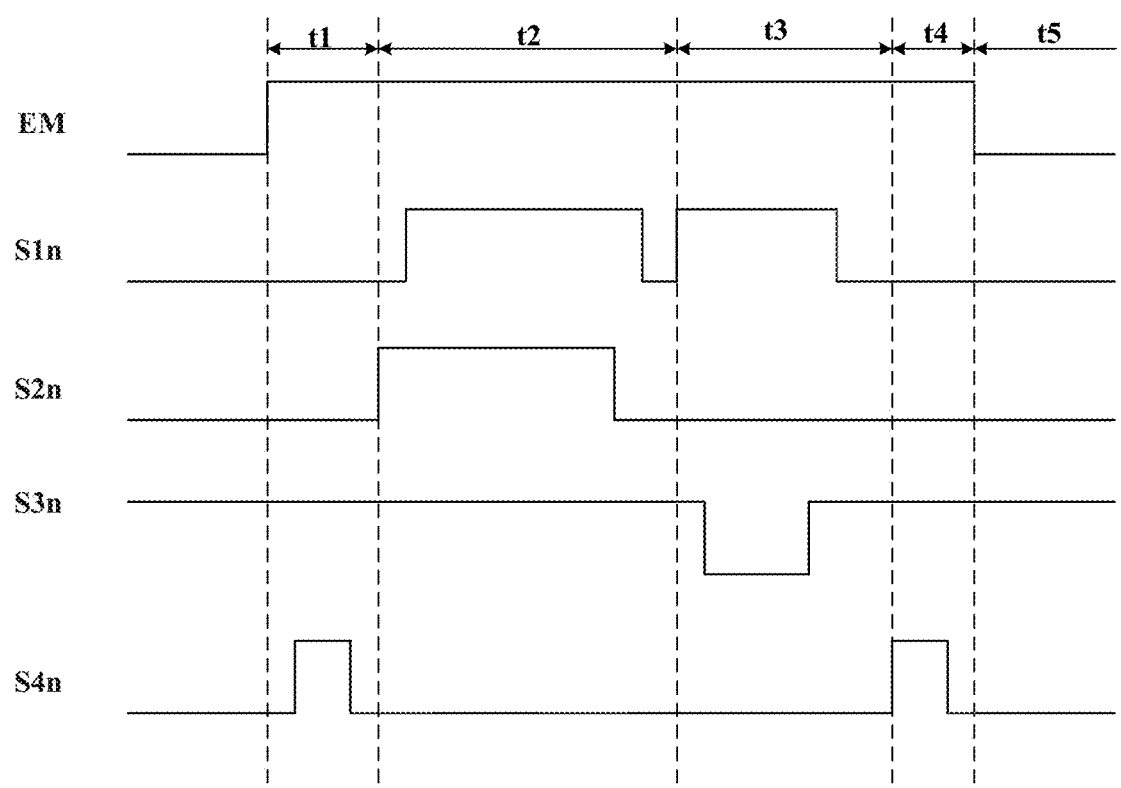
FIG. 8 is a timing diagram of control signals according to an embodiment of this application.

A difference from FIG. 5 lies in that, in the timing diagram shown in FIG. 8, in the first initialization phase t1 and the third initialization phase t4, the control signal S4n changes from a low level to a high level, and then changes from a high level to a low level. However, because the transistor T7 and the transistor T8 each are an oxide thin-film transistor, the same as FIG. 5, the transistor T7 and the transistor T8 each still change from being switched off to being switched on in the first initialization phase t1 and the third initialization phase t4, and then change from being switched on to being switched off. Therefore, the timing diagram shown in FIG. 7 can also implement resetting of the voltage of the node N3 and the anode voltage of the LED 1.

It can be seen from FIG. 8 that, a rising edge of a first drive pulse in the control signal S4n may be after a rising edge of a first drive pulse in the light emission control signal EM. In other words, in one image refresh period, after the transistor T2 and the transistor T5 each are switched off, the transistor T7 and the transistor T8 each may be switched on.

A rising edge of a second drive pulse in the control signal S4n may be after a falling edge of a second drive pulse in the control signal S1n. In other words, in one image refresh period, after the transistor T3 is switched off for a second time, the transistor T7 and the transistor T8 each may be switched on.

A falling edge of the second drive pulse in the control signal S4n may be before a falling edge of the first drive pulse in the light emission control signal EM. In other words, in one image refresh period, after the transistor T7 and the transistor T8 each are switched off for a second time, the transistor T2 and the transistor T5 each may be switched on.

It can also be seen from FIG. 8 that, a rising edge of the drive pulse in the control signal S3n may be before the falling edge of the second drive pulse in the control signal S1n. In other words, in the image refresh period, the transistor T3 is switched off only after the transistor T6 is switched off.

Quantities of respective drive pulses of the control signal S1n, the control signal S2n, and the control signal S3n each are in a high-level period of the first drive pulse of the light emission control signal EM. In other words, in one image refresh period, state switching of each of the transistor T3, the transistor T4, the transistor T6, the transistor T7, and the transistor T8 is performed when the transistor T5 and the transistor T2 are in an off state.

It should be noted that respective timings of the light emission control signal EM, the control signal S1n, the control signal S2n, and the control signal S3n in FIG. 8 are the same as respective timings of the light emission control signal EM, the control signal S1n, the control signal S2n, and the control signal S3n in FIG. 5 and FIG. 6. Details are not described in this embodiment of this application.

In another possible implementation, for FIG. 4, similar to FIG. 8, an entire light emission process in which the drive circuit 11 drives the LED 1 may also be divided into a first initialization phase t1, a second initialization phase t2, a threshold compensation phase t3, a third initialization phase t4, and a light emission phase t5 (only a part of the light emission phase t5 is also shown). A specific timing diagram may be shown in FIG. 9.

In some embodiments of this application, in the threshold compensation phase t3, a rising edge of the drive pulse in the control signal S5n may be before the rising edge of the second drive pulse in the control signal S4n. A falling edge of the drive pulse in the control signal S5n may be after the falling edge of the second drive pulse in the control signal S4n. In other words, after the transistor T7 is switched on, the transistor T8 may be switched on for a second time. In addition, after the transistor T8 is switched off for the second time, the transistor T7 may be switched off.

Figure 9:
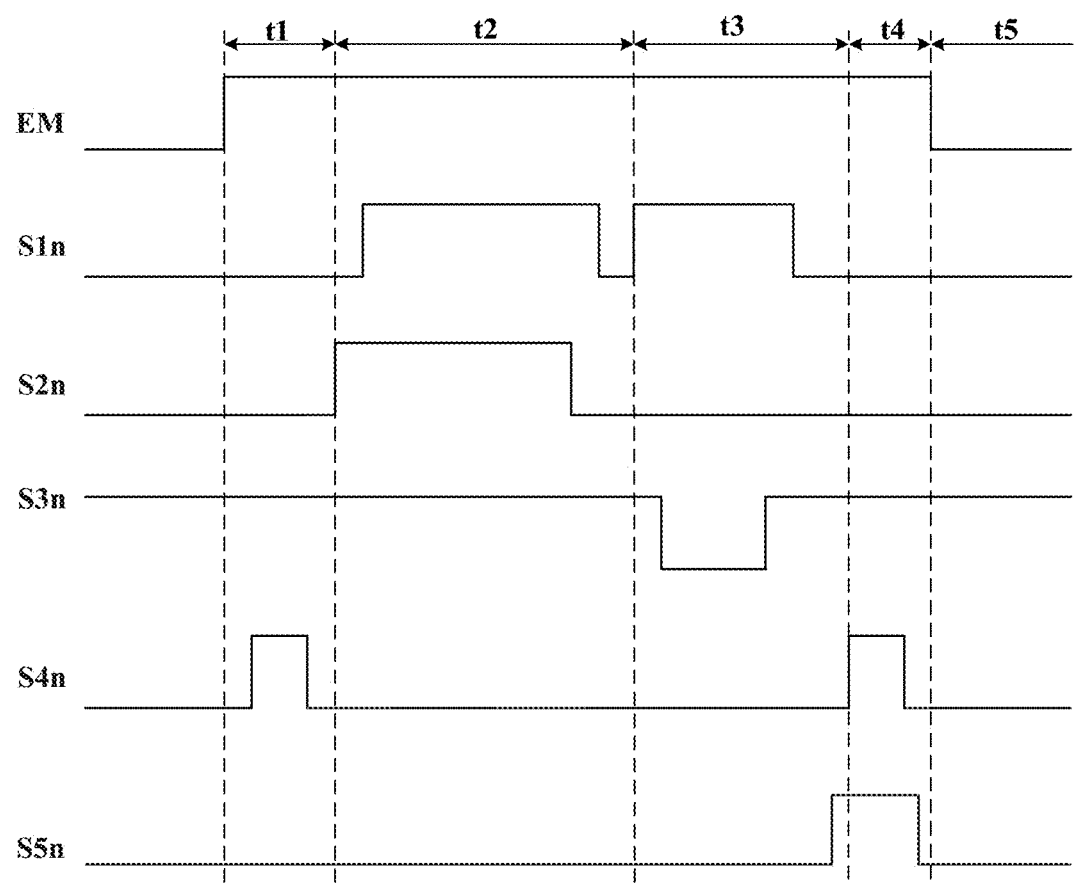
FIG. 9 is a timing diagram of control signals according to an embodiment of this application.

It should be noted that respective timings of the light emission control signal EM, the control signal S1n, the control signal S2n, the control signal S3n, and the control signal S4n in FIG. 9 are the same as respective timings of the light emission control signal EM, the control signal S1n, the control signal S2n, the control signal S3n, and the control signal S4n in FIG. 5. Details are not described in this embodiment of this application.

In the foregoing embodiments, there are two drive pulses in the control signal S1n, and there is one drive pulse in the control signal S2n. In other words, a quantity of drive pulses in the control signal S1n may be greater than a quantity of drive pulses in the control signal S2n.

In a possible implementation, the quantity of drive pulses in the control signal S1n may alternatively be equal to the quantity of drive pulses in the control signal S2n.

Figure 10:
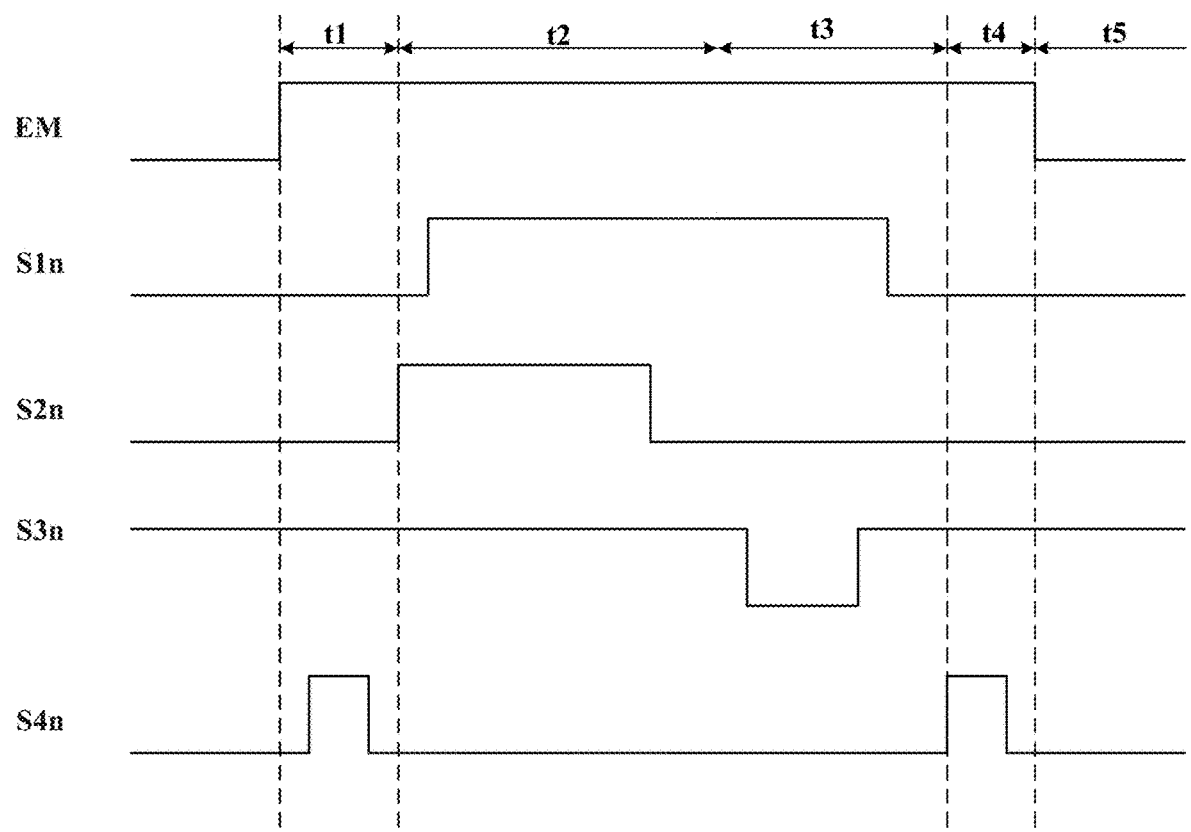
FIG. 10 is a timing diagram of control signals according to an embodiment of this application.

For example, as shown in FIG. 10, there is one drive pulse in the control signal S2n, and there may also be one drive pulse in the control signal S1n. Therefore, in an entire driving process of the LED, the transistor T3 may be switched on once, so that compensation for the threshold voltage of the transistor T1 can be implemented as soon as possible.

It should be noted that, in the drive circuits corresponding to the timing diagrams shown in FIG. 8 to FIG. 10, the transistor T7 and the transistor T8 use oxide thin-film transistors. Therefore, the transistor T7 and the transistor T8 may be suitable for use in a static display device with a low image refresh frequency, such as a watch or an e-book reader.

In the several embodiments provided in this application, it should be understood that the disclosed system and apparatus may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be indirect couplings or communication connections by using some interfaces, apparatuses, or units, and may also be connection in electrical, mechanical, or other forms.

The units described as separate components may be or may not be physically separated, and the components displayed as units may be or may not be physical units, that is, may be located in one place or distributed on a plurality of network units. Some or all of the units may be selected according to actual needs to achieve the objective of the solutions of embodiments.

In addition, the functional units in embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the methods described in embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A circuit, comprising:
   a first transistor electrically connected to a first power supply, a second power supply, a first node, and a third node;
   a second transistor electrically connected to the third node, a light emission control circuit, and a light-emitting diode;
   a third transistor electrically connected to the first node, a first control circuit, and a second node;
   a fourth transistor electrically connected to the second node, a second control circuit, and a third power supply; and
   a storage capacitor electrically connected to the second power supply and the first node,
   wherein:
   the storage capacitor is configured to store, via the first transistor, a first voltage provided by the first power supply;
   the first transistor is configured to control a voltage of the third node based on the first voltage stored by the storage capacitor and a second voltage provided by the second power supply;
   the second transistor is configured to control a drive current of the light-emitting diode based on a light emission control signal provided by the light emission control circuit and from the voltage of the third node;
   the third transistor is configured to:
      control a voltage of a control electrode of the first transistor based on a first control signal provided by the first control circuit and from a voltage of the second node, and
      compensate for a threshold voltage of the first transistor based on the first control signal and the first voltage provided by the first power supply;
   the fourth transistor is configured to control the voltage of the second node based on a second control signal provided by the second control circuit and from a third voltage provided by the third power supply;
   the second node is electrically connected to the third node such that the voltage of the second node is equal to the voltage of the third node; and
   wherein during an image refresh period, a quantity of drive pulses in the light emission control signal is greater than or equal to 2.

2. The circuit according to claim 1, wherein during the image refresh period, a quantity of drive pulses in the first control signal is greater than or equal to a quantity of drive pulses in the second control signal.

3. The circuit according to claim 1, further comprising:
   a fifth transistor with a first electrode electrically connected to the second power supply, a control electrode electrically connected to the light emission control circuit, and a second electrode electrically connected to a fourth node;
   a sixth transistor with a first electrode electrically connected to the first power supply, a control electrode electrically connected to a third control circuit, and a second electrode electrically connected to the fourth node, wherein the fourth node is electrically connected to the first transistor;
   wherein:
   the fifth transistor is configured to control a voltage of the fourth node in response to the light emission control signal and from the second voltage; and
   the sixth transistor is configured to control the voltage of the fourth node in response to a third control signal provided by the third control circuit and from the first voltage.

4. The circuit according to claim 3, wherein the first transistor is configured to:
   control the voltage of the third node based on the voltage of the fourth node and the voltage of the control electrode of the first transistor.

5. The circuit according to claim 3, wherein a frequency of a drive pulse in the third control signal is equal to an image refresh frequency.

6. The circuit according to claim 3, further comprising:
   a seventh transistor with a control electrode electrically connected to a fourth control circuit or a fifth control circuit, a first electrode electrically connected to an anode of the light-emitting diode, and a second electrode electrically connected to a fifth power supply;
   an eighth transistor with a control electrode electrically connected to the fourth control circuit, a first electrode electrically connected to the third node, and a second electrode electrically connected to a sixth power supply;
   wherein:
   the seventh transistor is configured to control an anode voltage of the light-emitting diode from a fifth voltage provided by the fifth power supply and based on a fourth control signal provided by the fourth control circuit or, if electrically connected to the fifth control circuit, based on a fifth control signal provided by the fifth control circuit; and
   the eighth transistor is configured to control the voltage of the third node based on the fourth control signal and from a sixth voltage provided by the sixth power supply.

7. The circuit according to claim 3, wherein during the image refresh period, a quantity of drive pulses in a fourth control signal is greater than or equal to the quantity of drive pulses in the light emission control signal.

8. The circuit according to claim 7, wherein a frequency of a drive pulse in a fifth control signal is equal to an image refresh frequency.

9. The circuit according to claim 3, wherein a frequency of a drive pulse in a fourth control signal is N/2 times a frequency of a drive pulse in the third control signal, wherein N≥2, and N is an integer.

10. The circuit according to claim 3, wherein the first transistor, the second transistor, the fifth transistor, and the sixth transistor each are a low-temperature polycrystalline silicon thin-film transistor; and
the third transistor and the fourth transistor each are an oxide thin-film transistor.

11. The circuit according to claim 10, wherein a seventh transistor and an eighth transistor each are a low-temperature polycrystalline silicon thin-film transistor.

12. The circuit according to claim 11, wherein during the image refresh period, a falling edge of a first drive pulse in a fourth control signal is after a rising edge of a first drive pulse in the light emission control signal.

13. The circuit according to claim 11, wherein during an image refresh period, a falling edge of a last drive pulse in a fourth control signal is after a falling edge of a last drive pulse in the first control signal; and
a rising edge of the last drive pulse in the fourth control signal is before a falling edge of a first drive pulse in the light emission control signal.

14. The circuit according to claim 11, wherein during the image refresh period, a falling edge of a drive pulse in a fifth control signal is before a falling edge of a last drive pulse in a fourth control signal; and
a rising edge of the drive pulse in the fifth control signal is after a rising edge of the last drive pulse in the fourth control signal.

15. The circuit according to claim 11, wherein during the image refresh period, a rising edge of a drive pulse in the third control signal is before a falling edge of a last drive pulse in the first control signal.

16. The circuit according to claim 11, wherein quantities of drive pulses of the first control signal, drive pulses of the second control signal, drive pulses of the third control signal, and drive pulses of a fifth control signal each occur during a period when a first drive pulse in the light emission control signal is in a high state.

17. A display device, comprising:
a first power supply, a second power supply, a third power supply, a light emission control circuit, a first control circuit, a second control circuit, a plurality of light-emitting diodes, and a plurality of drive circuits, wherein:
each of the plurality of drive circuits comprises:
a first transistor electrically connected to the first power supply, the second power supply, a first node, and a third node;
a second transistor electrically connected to the third node, the light emission control circuit, and one of the plurality of light-emitting diodes;
a third transistor electrically connected to the first node, the first control circuit, and a second node;
a fourth transistor electrically connected to the second node, the second control circuit, and the third power supply; and
a storage capacitor electrically connected to the second power supply and the first node,
wherein:
the storage capacitor is configured to store, via the first transistor, a first voltage provided by the first power supply;
the first transistor is configured to control a voltage of the third node from the first voltage stored by the storage capacitor and a second voltage provided by the second power supply;
the second transistor is configured to control a drive current of its light-emitting diode in response to a light emission control signal provided by the light emission control circuit and from the voltage of the third node;
the third transistor is configured to:
control a voltage of a control electrode of the first transistor in response to a first control signal provided by the first control circuit and from a voltage of the second node, and compensate for a threshold voltage of the first transistor based on the first control signal and the first voltage provided by the first power supply;
the fourth transistor is configured to control the voltage of the second node in response to a second control signal provided by the second control circuit and from a third voltage provided by the third power supply; and
the second node is electrically connected to the third node such that the voltage of the second node is equal to the voltage of the third node; and
wherein during an image refresh period, a quantity of drive pulses in the light emission control signal is greater than or equal to 2.

18. The display device according to claim 17, wherein during the image refresh period, a quantity of drive pulses in the first control signal is greater than or equal to a quantity of drive pulses in the second control signal.

19. A screen comprising a circuit, the circuit comprising:
a first transistor electrically connected to a first power supply, a second power supply, a first node, and a third node;
a second transistor electrically connected to the third node, a light emission control circuit, and a light-emitting diode;
a third transistor electrically connected to the first node, a first control circuit, and a second node;
a fourth transistor electrically connected to the second node, a second control circuit, and a third power supply; and
a storage capacitor electrically connected to the second power supply and the first node,
wherein:
the storage capacitor is configured to store, via the first transistor, a first voltage provided by the first power supply;
the first transistor is configured to control a voltage of the third node based on the first voltage stored by the storage capacitor and a second voltage provided by the second power supply;
the second transistor is configured to control a drive current of the light-emitting diode based on a light emission control signal provided by the light emission control circuit and from the voltage of the third node;
the third transistor is configured to:
control a voltage of a control electrode of the first transistor based on a first control signal provided by the first control circuit and from a voltage of the second node, and compensate for a threshold voltage of the first transistor based on the first control signal and the first voltage provided by the first power supply;

the fourth transistor is configured to control the voltage of the second node based on a second control signal provided by the second control circuit and from a third voltage provided by the third power supply;

the second node is electrically connected to the third node such that the voltage of the second node is equal to the voltage of the third node; and wherein during an image refresh period, a quantity of drive pulses in the light emission control signal is greater than or equal to 2.

20. The screen according to claim 19, wherein during the image refresh period, a quantity of drive pulses in the first control signal is greater than or equal to a quantity of drive pulses in the second control signal.

\* \* \* \* \*